United States Patent
Yamanaka et al.

[19]

[11] Patent Number: 5,994,933
[45] Date of Patent: Nov. 30, 1999

[54] SEMICONDUCTOR DEVICE FOR CONTROLLING A DELAY TIME OF AN OUTPUT SIGNAL OF A PLL

[75] Inventors: Tadao Yamanaka; Shinichi Nakagawa, both of Tokyo, Japan

[73] Assignees: Mitsubishi Denki Kabushiki Kaisha; Mitsubishi Electric Engineering Co., Ltd., both of Tokyo, Japan

[21] Appl. No.: 08/790,016

[22] Filed: Jan. 28, 1997

[30] Foreign Application Priority Data

Aug. 27, 1996 [JP] Japan ................................ 8-225175

[51] Int. Cl.⁶ ........................... H03B 27/00; H03L 7/099
[52] U.S. Cl. ......................... 327/158; 327/156; 327/270; 331/57; 331/60
[58] Field of Search ..................... 327/156–159, 327/161, 153, 147–150, 243, 244, 250, 251, 269–271, 284, 285; 331/57, 60

[56] References Cited

U.S. PATENT DOCUMENTS

| | | | |
|---|---|---|---|
| 5,126,691 | 6/1992 | Mijuskovic et al. | 331/1 A |
| 5,233,316 | 8/1993 | Yamada et al. | 331/45 |
| 5,347,234 | 9/1994 | Gersbach et al. | 331/57 |
| 5,389,898 | 2/1995 | Taketoshi et al. | 331/25 |
| 5,451,894 | 9/1995 | Guo | 327/241 |
| 5,594,392 | 1/1997 | Kondoh et al. | 331/57 |
| 5,646,564 | 7/1997 | Erickson et al. | 327/158 |
| 5,751,775 | 5/1998 | Fensch et al. | 375/371 |
| 5,802,027 | 9/1998 | Senshu | 369/48 |

FOREIGN PATENT DOCUMENTS

| | | |
|---|---|---|
| 4-20016 | 1/1992 | Japan . |
| 7-288447 | 10/1995 | Japan . |

*Primary Examiner*—Timothy P. Callahan
*Assistant Examiner*—Eunja Shin
*Attorney, Agent, or Firm*—Burns, Doane, Swecker & Mathis, LLP

[57] ABSTRACT

It is an object to obtain a semiconductor device capable of changing a delay time of an output signal of a PLL circuit with respect to an external clock signal after installed in a system. An external clock signal is inputted to an input terminal (1.) An address value is inputted to an input terminal (3.) A decoder (9) selects one of a plurality of delay times in a voltage-controlled oscillator (8) according to the address value. The phase of a signal outputted to an output terminal (2) is delayed with respect to the external clock signal at the input terminal (1) by the delay time selected. Accordingly, it is possible to change the delay time of the output signal of the PLL circuit with respect to the external clock signal after installation in a system.

10 Claims, 10 Drawing Sheets

SEMICONDUCTOR DEVICE FOR CONTROLLING A DELAY TIME OF AN OUTPUT SIGNAL OF A PLL

BACKGROUND OF THE INVENTION

1. Field of the Invention

The present invention relates to semiconductor devices having PLL circuits, and particularly to a semiconductor device which requires controlling a delay time of an output signal of the PLL circuit.

2. Description of the Background Art

In order to increase the margins of a setup time of data input to an LSI and a hold time of the data output, a clock signal inside the LSI (an internal clock signal) is phase-adjusted with respect to a clock signal inputted from the outside of the LSI (an external clock signal.) For external data, as shown in FIG. 15, the setup time is the time t set from the point at which external data is prepared to the point at which the external data is captured inside (to the rising edge of the internal clock signal in FIG. 15.) For internal data, it corresponds to the time t set from the point at which internal data is prepared to the point at which the internal data is outputted to the outside (to the rising edge of the internal clock signal in FIG. 15.) The hold time is, concerning external data, the time t hold in which the external data is continuously kept ready after captured inside, as shown in FIG. 15. Concerning internal data, it corresponds to the time t hold in which the internal data is continuously kept ready after outputted to the outside. The phase-locked loop circuit (PLL circuit) is suitable for the adjustment of the internal clock signal.

FIG. 10 is a block diagram showing a conventional semiconductor device. In FIG. 10, 1 denotes an input terminal for inputting an external clock signal with a cycle CL, 2 denotes an output terminal for outputting an internal clock signal, 6 denotes a phase detector, 7 denotes a loop filter for filtering an output of the phase detector 6, 8 denotes a voltage-controlled oscillator, 11 denotes a delay circuit, 4 denotes one input terminal of the phase detector 6 for inputting a signal from the delay circuit 11, 5 denotes the other input terminal of the phase detector 6 for inputting a signal from the voltage-controlled oscillator 8, 10 denotes an output terminal of the voltage-controlled oscillator 8, and 16 denotes an input terminal of the voltage-controlled oscillator 8.

Next, the structure of the semiconductor device shown in FIG. 10 will be described. The delay circuit 11 has its input connected to the input terminal 1 and its output connected to the input terminal 4. The output of the phase detector 6 is connected to the input of the loop filter 7. The output of the loop filter 7 is connected to the input terminal 16. The output terminal 10 is connected to the output terminal 2 and to the input terminal 5. The phase detector 6, the loop filter 7 and the voltage-controlled oscillator 8 form a PLL circuit.

FIG. 11 is a circuit diagram showing the internal configuration of the voltage-controlled oscillator 8. In FIG. 11, 8b denotes an inverting amplifier, 8a denotes a control portion for controlling the inverting amplifiers 8b according to a signal at the input terminal 16, INV denotes an inverter, and other characters correspond to those in FIG. 10. Next, the configuration of the voltage-controlled oscillator 8 will be described. The plurality of inverting amplifiers 8b are connected in a loop to form a ring oscillator. An output of one of the plurality of inverting amplifiers 8b is connected to the output terminal 10 through the inverter INV. The control portion 8a has its input connected to the input terminal 16 and its output connected to each inverting amplifier 8b.

FIG. 12 is a circuit diagram showing an example of internal configuration of the delay circuit 11. In FIG. 12, INV denotes an inverter, R denotes a resistance, C denotes a capacitance and other characters correspond to those in FIG. 10. A delay circuit having multistage-connected inverters to utilize delays between inputs and outputs of the inverters may be used instead of that shown in FIG. 12.

Next, operation of the semiconductor device shown in FIG. 10 will be described. FIG. 13 is a timing chart showing the relation between an external clock signal at the input terminal 1 and an internal clock signal at the output terminal 2. The PLL circuit operates so that the phase of the signal at the input terminal 4 and that of the internal clock signal at the output terminal 2 coincide with each other. The delay circuit 11 receives the external clock signal at the input terminal 1 to provide a signal delayed by a delay time td2 with respect to the external clock signal to the input terminal 4. Accordingly, the internal clock signal at the output terminal 2 is delayed in phase by the delay time td2 behind the external clock signal at the input terminal 1. In other words, the phase of the internal clock signal at the output terminal 2 is apparently more advanced than that of the external clock signal at the input terminal 1 by a delay time td1 (=the cycle of the external clock signal −the delay time td2.)

The conventional semiconductor device having the PLL constructed as stated above have the problems given below.

First, when the delay time is realized with the delay circuit 11 including the capacitance C and the resistance R, a larger layout area is required for the capacitance C and the resistance R as a larger delay time is required. When it is realized with a delay circuit utilizing delays of inverters, then the number of inverters INV increases to increase the layout area.

Furthermore, since the capacitance value of the capacitance C and the resistance value of the resistance R and the like are affected by process, the delay time may differ with different processes. Even with the same process, the delay time may differ because of different finish states caused by different conditions.

Moreover, for example, consider the case in which an LSI containing the semiconductor device shown in FIG. 10 is installed in a system such as a board and an external clock signal is supplied from the system. The delay circuit 11 is designed considering the cycle of the external clock signal. If there are a plurality of systems with external clock signals having different cycles, a delay circuit 11 must be designed for each system. Thus it introduces the problem that the delay circuit 11 must be designed according to the cycle of the external clock signal.

Furthermore, since the delay time is one fixed value, it is impossible to deal with various setup times and hold times. For example, consider that the PLL circuit shown in FIG. 10 is contained in an LSI to output internal data generated inside the LSI in synchronization with the internal clock signal and capture external data generated outside the LSI in synchronization with the internal clock signal. Referring to FIG. 15, the time t hold and the time t set can be changed by setting the delay time in the delay circuit 11 in the designing step to change the delay time of the internal clock signal. However, if the time t hold in capturing external data is lengthened by changing the delay time of the internal clock, the time t set in outputting internal data becomes shorter. On the other hand, if the time t set in capturing external data is lengthened, the time t hold in outputting internal data becomes shorter. This way, the setup time and the hold time are in a trade-off relation. Hence, changing one of the setup time and the hold time causes the other to change. Thus the setup time and the hold time can not be independently adjusted.

SUMMARY OF THE INVENTION

According to a first aspect of the present invention, a semiconductor device comprises: delay signal generating means for generating a plurality of delay signals with different delay times with respect to a reference clock signal; a control terminal for inputting a control signal used to select one of the plurality of delay signals; delay signal selecting means receiving the control signal from the control terminal for selecting one of the plurality of delay signals on the basis of the control signal; and a PLL circuit for outputting a clock signal having a phase shifted by the delay time of the selected delay signal with respect to the reference clock signal on the basis of the delay signal selected by the delay signal selecting means.

Preferably, according to a second aspect of the present invention, in the semiconductor device, the PLL circuit includes a voltage-controlled oscillator having a plurality of inverting amplifiers connected in a loop, wherein the delay signal generating means is the voltage-controlled oscillator and the plurality of delay signals are output signals of the plurality of inverting amplifiers.

Preferably, according to a third aspect of the present invention, in the semiconductor device, the delay signal selecting means is plural in number, and the PLL circuit outputs on the basis of a plurality of delay signals individually selected by the plurality of delay signal selecting means a plurality of clock signals corresponding to the plurality of delay signals selected.

Preferably, according to a fourth aspect of the present invention, the semiconductor device further comprises a first latch circuit receiving one of the plurality of clock signals for capturing externally generated data according to this clock signal and a second latch circuit receiving another one of the plurality of clock signals for outputting internally generated data according to this clock signal.

Preferably, according to a fifth aspect of the present invention, the semiconductor device further comprises a CPU for generating the control signal according to the cycle of the reference clock signal and outputting the control signal to the control terminal.

According to the first aspect of the present invention, the provision of the control terminal receiving a control signal for selecting a delay provides the effect of enabling a change of a delay of an output signal of the PLL circuit with respect to a reference clock signal after installation in a system.

According to the second aspect of the present invention, the use of outputs of the inverting amplifiers in the voltage-controlled oscillator included in the PLL circuit as delay signals eliminates the necessity of separately providing means for generating a delay signal, thus providing the effects of reducing the layout area and avoiding variation of the delay due to different processes.

The third aspect of the present invention provides the effect of enabling the application to a semiconductor device which requires a plurality of clock signals with changeable delays with respect to the reference clock signal and to a system equipped with the semiconductor device.

The fourth aspect of the present invention provides the effect of obtaining a semiconductor device capable of independently setting a setup time and a hold time.

The fifth aspect of the present invention provides the effect of automatically controlling a delay of an output signal of the PLL circuit with respect to a reference clock signal depending on the cycle of the reference clock signal with a CPU.

The present invention has been made to solve the problems shown above, and it is an object of the present invention to obtain a semiconductor device which is capable of changing a delay time of an internal clock signal outputted from a PLL circuit with respect to an external clock signal after installed in a system, and capable of reducing the layout area, reducing variation in delay time due to process and independently adjusting a setup time and a hold time.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a circuit diagram showing the internal structure of the delay circuit 11a.

DESCRIPTION OF THE PREFERRED EMBODIMENTS

Background of the Preferred Embodiments

Figure 1:
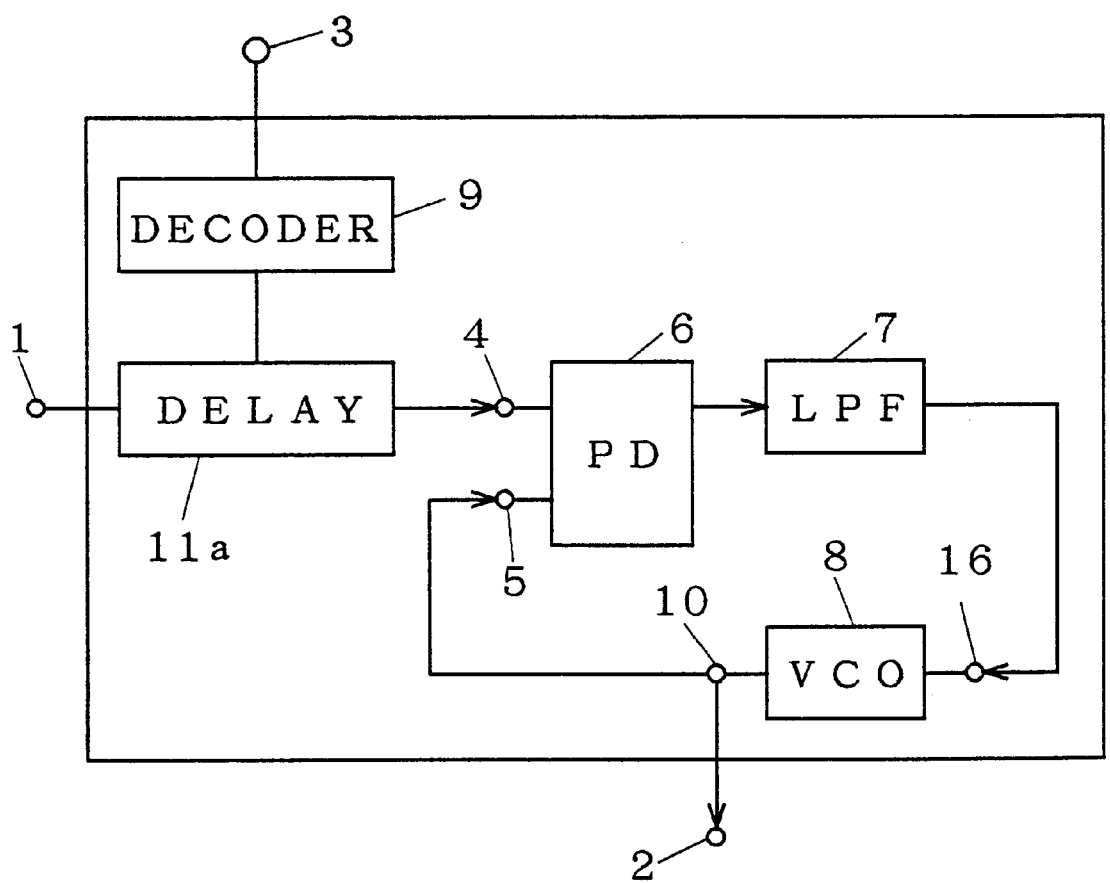
FIG. 1 is a block diagram showing a semiconductor device in the background of the preferred embodiments of the present invention.

FIG. 1 is a block diagram showing a semiconductor device according to a background of the preferred embodiments. In FIG. 1, 1 denotes an input terminal for inputting an external clock signal (a reference clock signal) with a cycle CL, 2 denotes an output terminal for outputting an internal clock signal, 3 denotes an input terminal (control terminal) for inputting a control signal for selecting a delay time, 6 denotes a phase detector, 7 denotes a loop filter for filtering an output of the phase detector 6, 8 denotes a voltage-controlled oscillator, 9 denotes a decoder, 11a denotes a delay circuit (delay signal generating means), 4 denotes one input terminal of the phase detector 6 for inputting a signal from the delay circuit 11a, 5 denotes the other input terminal of the phase detector 6 for inputting a signal from the voltage-controlled oscillator 8, 10 denotes an output terminal of the voltage-controlled oscillator 8, and 16 denotes an input terminal of the voltage-controlled oscillator 8.

Next, the structure of the semiconductor device shown in FIG. 1 will be described. The input of the decoder 9 is connected to the input terminal 3. The delay circuit 11a has its one input connected to the input terminal 1, its other input connected to the output of the decoder 9, and its output connected to the input terminal 4. The output of the phase detector 6 is connected to the input of the loop filter 7. The output of the loop filter 7 is connected to the input terminal 16. The output terminal 10 is connected to the output terminal 2 and to the input terminal 5. The phase detector 6, the loop filter 7 and the voltage-controlled oscillator 8 form a PLL circuit. Switches SW and the decoder 9 form delay signal selecting means.

Figure 2:
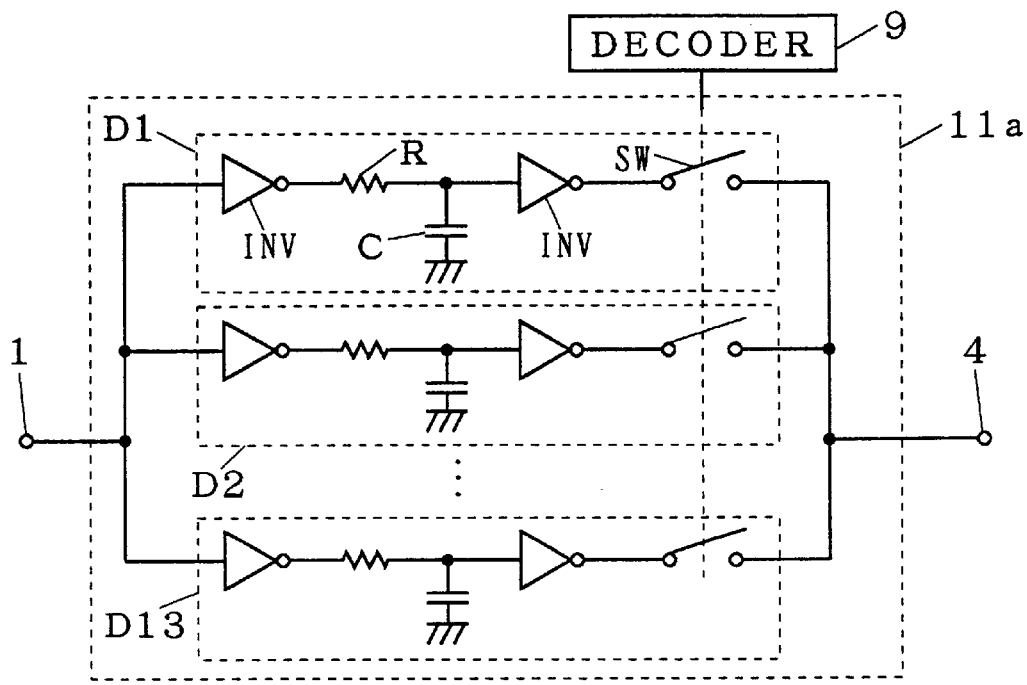

FIG. 2 is a circuit diagram showing the internal configuration of the delay circuit 11a. In FIG. 2, Dn (n=1, 2,..., 13) denotes a delay circuit block, INV denotes an inverter, R denotes a resistance, C denotes a capacitance, SW denotes a switch, and other reference characters correspond to those in FIG. 1. The delay circuit 11a is composed of 13 delay circuit blocks. The switch SW included in each delay circuit block D1–D13 is on/off controlled by the decoder 9. A delay time td2 in a delay circuit block Dn is given as:

$$\text{Delay time td2} = \text{time CL}_F \times (n-1) \div 13 + \text{time CL}_F \qquad (1)$$

The time $CL_F$ is preferably a fixed-length time and is equal to the cycle CL. For example, the delay time td2 in the delay circuit block D1 corresponds to the time $CL_F$. The delay time td2 in the delay circuit block D2 corresponds to the time $CL_F/13$+time $CL_F$.

Next, the operation of the semiconductor device shown in FIG. 1 will be described. An external clock signal is inputted to the input terminal 1. The decoder 9 receives an address value at the input terminal 3 to output a control signal composed of a plurality of bits at an "H" or an "L" level depending on the address value. In FIG. 2, the control signal is required to have 13 bits. The plurality of bits are individually assigned to the switches SW in the delay circuit blocks Dn. Depending on whether a bit is at an "H" or an "L" level, the switch SW turns on or off. That is to say, the address value at the input terminal 3 independently turns on or off the plurality of switches SW. Such a control signal is inputted to the input terminal 3 that a switch SW in one of the plurality of delay circuit blocks turns on. The delay circuit 11a outputs a delay signal delayed in phase behind the external clock signal at the input terminal 1 by a delay time td2 generated by the delay circuit block whose switch SW is on. The PLL circuit outputs an internal clock signal in phase with the signal at the input terminal 4 to the output terminal 2. Accordingly, the phase of the internal clock signal outputted to the output terminal 2 is delayed by the time td2 with respect to the external clock signal at the input terminal 1.

For example, when it is desirable to delay the phase of the internal clock signal outputted to the output terminal 2 by a time $CL_F/13$ after the external clock signal at the input terminal 1, such a control signal as turns on only the switch SW in the delay circuit block D2 is inputted to the input terminal 3. When only the switch SW in the delay circuit block D1 is turned on, the phase of the internal clock signal outputted to the output terminal 2 is the same as the phase of the external clock signal at the input terminal 1.

Figure 14:
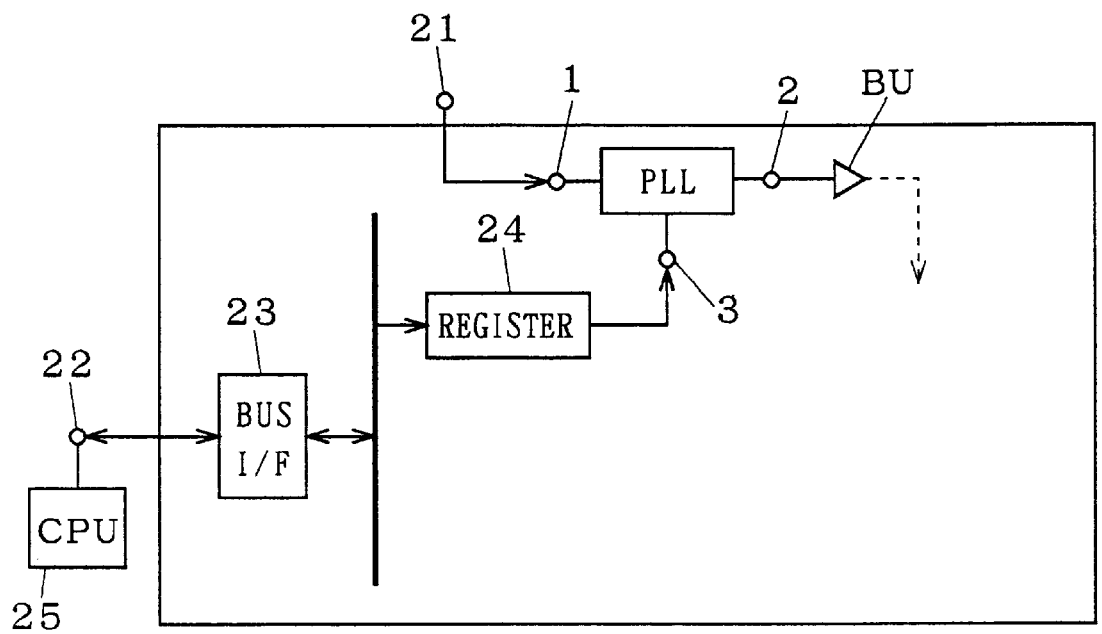
FIG. 14 is a block diagram showing the inside of an LSI having the PLL circuit of the present invention.
Figure 15:
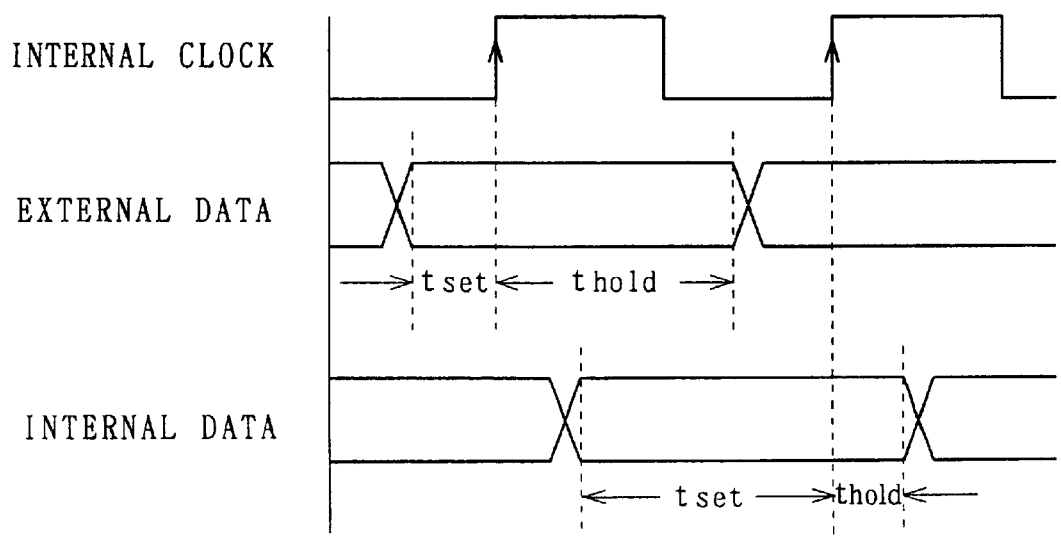
FIG. 15 is a diagram for illustrating a setup time and a hold time.

FIG. 14 is a block diagram showing an example of an LSI containing the semiconductor device shown in FIG. 1. In FIG. 14, 21 and 22 denote external terminals of the LSI, 23 denotes an interface portion such as a bus, 24 denotes a register, 25 denotes a CPU, BU denotes a buffer, PLL denotes the semiconductor device shown in FIG. 1, and other characters correspond to those in FIG. 1. A control signal applied to the external terminal 22 is stored in the register 24 through the interface portion 23. The register 24 applies the stored control signal to the input terminal 3. An external clock signal applied to the external terminal 21 is provided to the input terminal 1. The internal clock signal outputted to the output terminal 2 is provided to individual parts in the LSI through the buffer BU. The LSI shown in FIG. 14 is installed in a system such as a board and the external terminal 22 is connected to an output of the CPU 25 or the like. The CPU 25 outputs such a control signal that the hold time and the setup time are predetermined values or larger from the cycle of the external clock signal according to program. Accordingly, even after the LSI has been installed in the system, the CPU 25 changes the delay time according to the cycle of the external clock signal with the program, facilitating adjustment of the delay time after installation of the LSI in the system. The external terminal of the LSI may in the alternative, be connected directly to the register 24 without going through a bus interface.

According to the configuration explained above, changing the delay time of the delay circuit 11 by applying a control signal to the input terminal 1 eliminates the necessity of designing the delay circuit 11 depending on the cycle of the external clock signal. Furthermore, since it is possible to change the delay time even after the LSI containing the semiconductor device of this preferred embodiment is installed in a system such as a board, the system equipped with the LSI can deal with a variety of external clock signals.

First Preferred embodiment

In the background of the preferred embodiments, the delay time selectable in the delay circuit 11a includes fixed values in units of time $CL_F/13$. Hence, it can not deal with external clocks with a variety of cycles. Dealing with a more variety of cycles of external clocks requires a larger number of delay circuit blocks, for example. This requires a larger layout area. A semiconductor device which can solve the problem will now be described.

Figure 3:
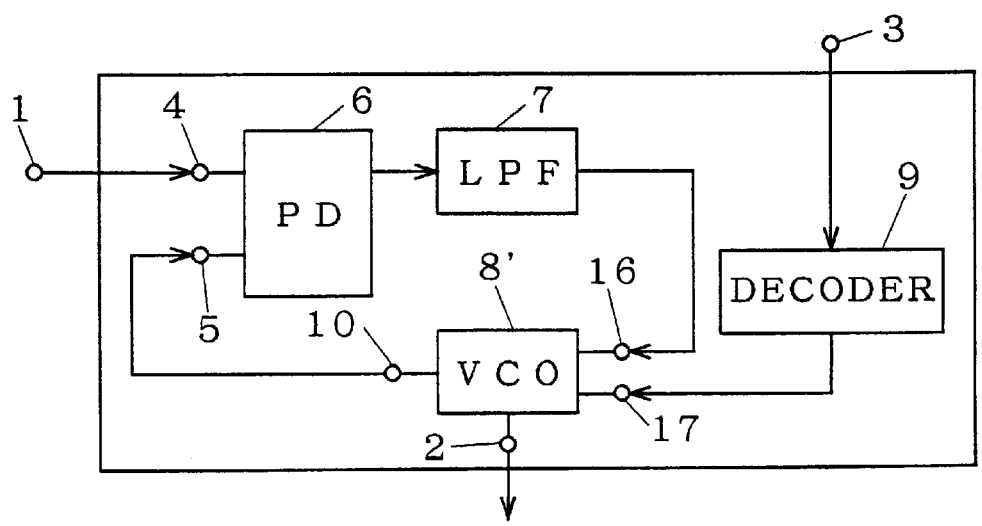
FIG. 3 is a block diagram showing an example of a semiconductor device according to a first preferred embodiment of the present invention.
Figure 10:
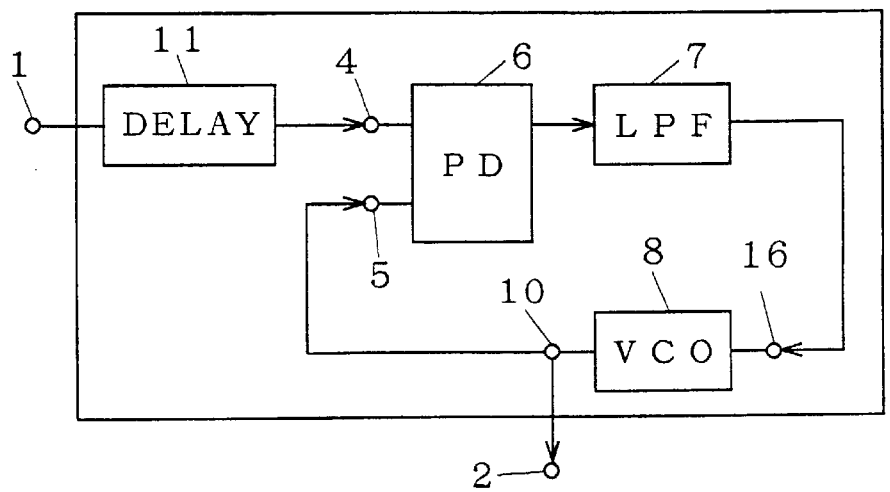
FIG. 10 is a block diagram showing a conventional semiconductor device.
Figure 11:
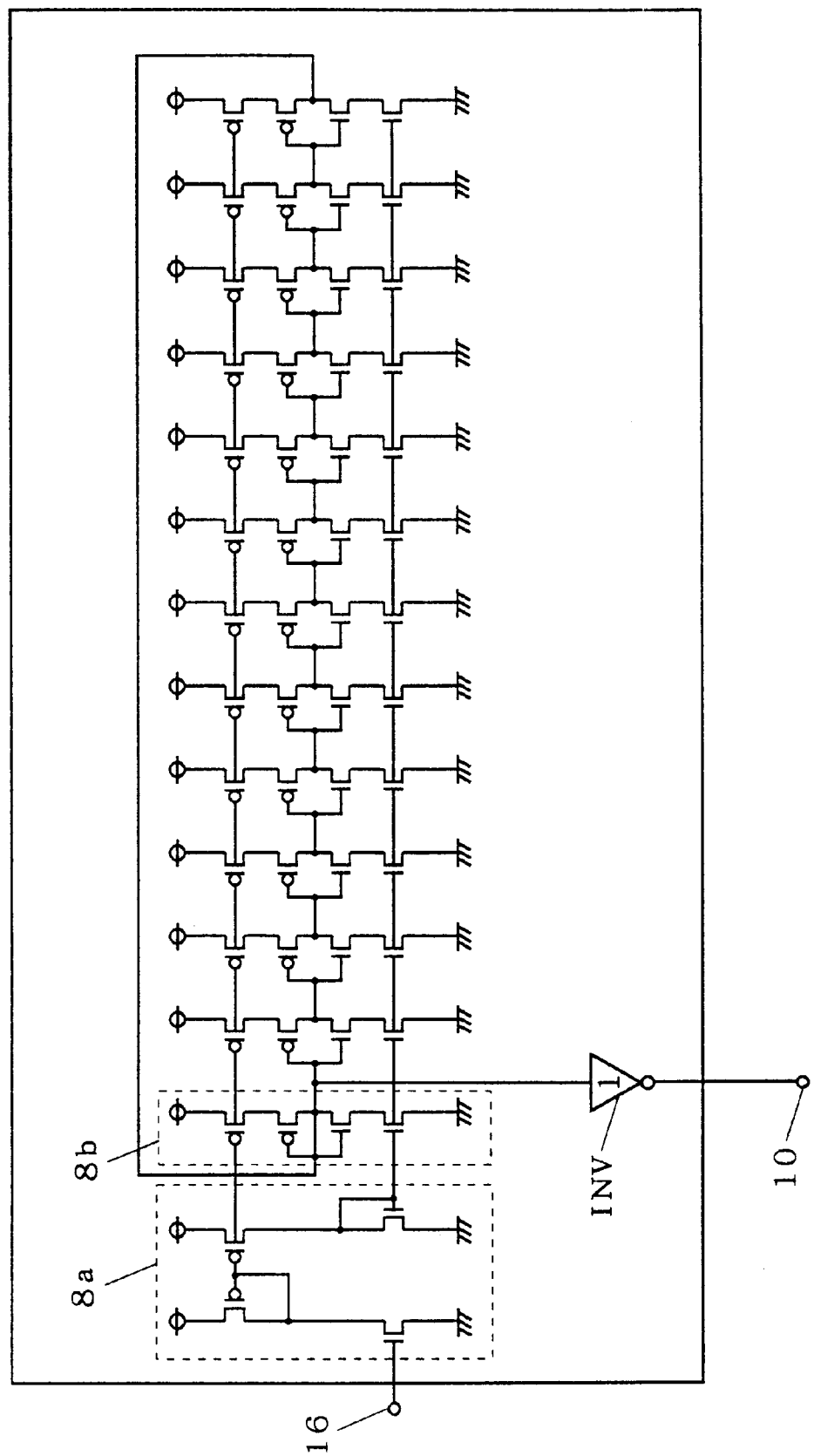
FIG. 11 is a circuit diagram showing the internal structure of the voltage-controlled oscillator 8.
Figure 12:
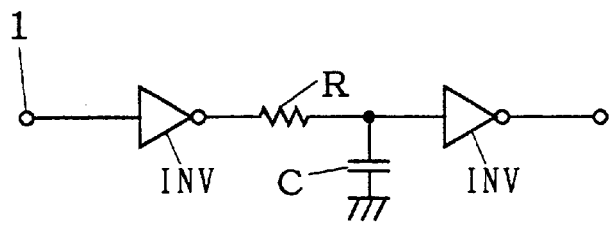
FIG. 12 is a circuit diagram showing the internal structure of the delay circuit 11.
Figure 13:
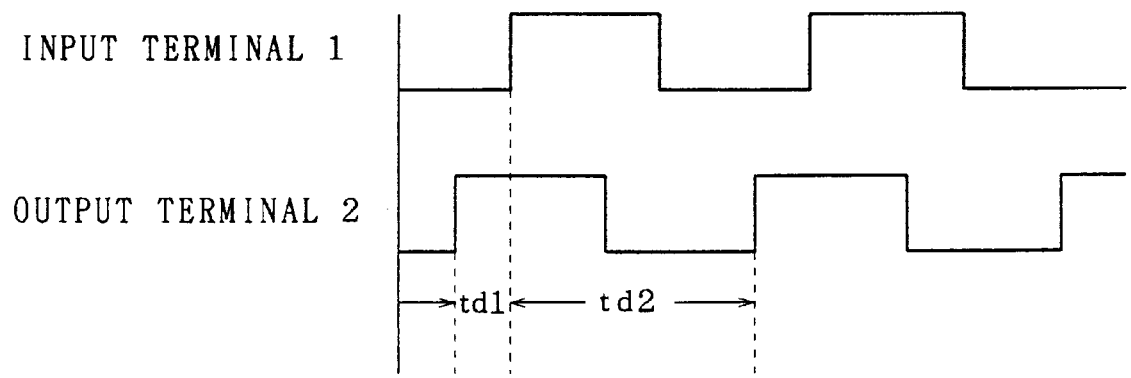
FIG. 13 is a timing chart showing the relation between the signal at the input terminal 1 and the signal at the output terminal 2.

FIG. 3 is a block diagram showing a semiconductor device according to a first preferred embodiment of the present invention. In FIG. 3, 8' denotes a voltage-controlled oscillator which corresponds to the voltage-controlled oscillator 8 of FIG. 10, 17 denotes an input terminal of the voltage-controlled oscillator 8', and other characters correspond to those in FIG. 1.

Next, the structure of the semiconductor device shown in FIG. 3 will be described. The input terminal 17 is connected to the output of the decoder 9. The input terminal 4 is connected to the input terminal 1.

Figure 4:
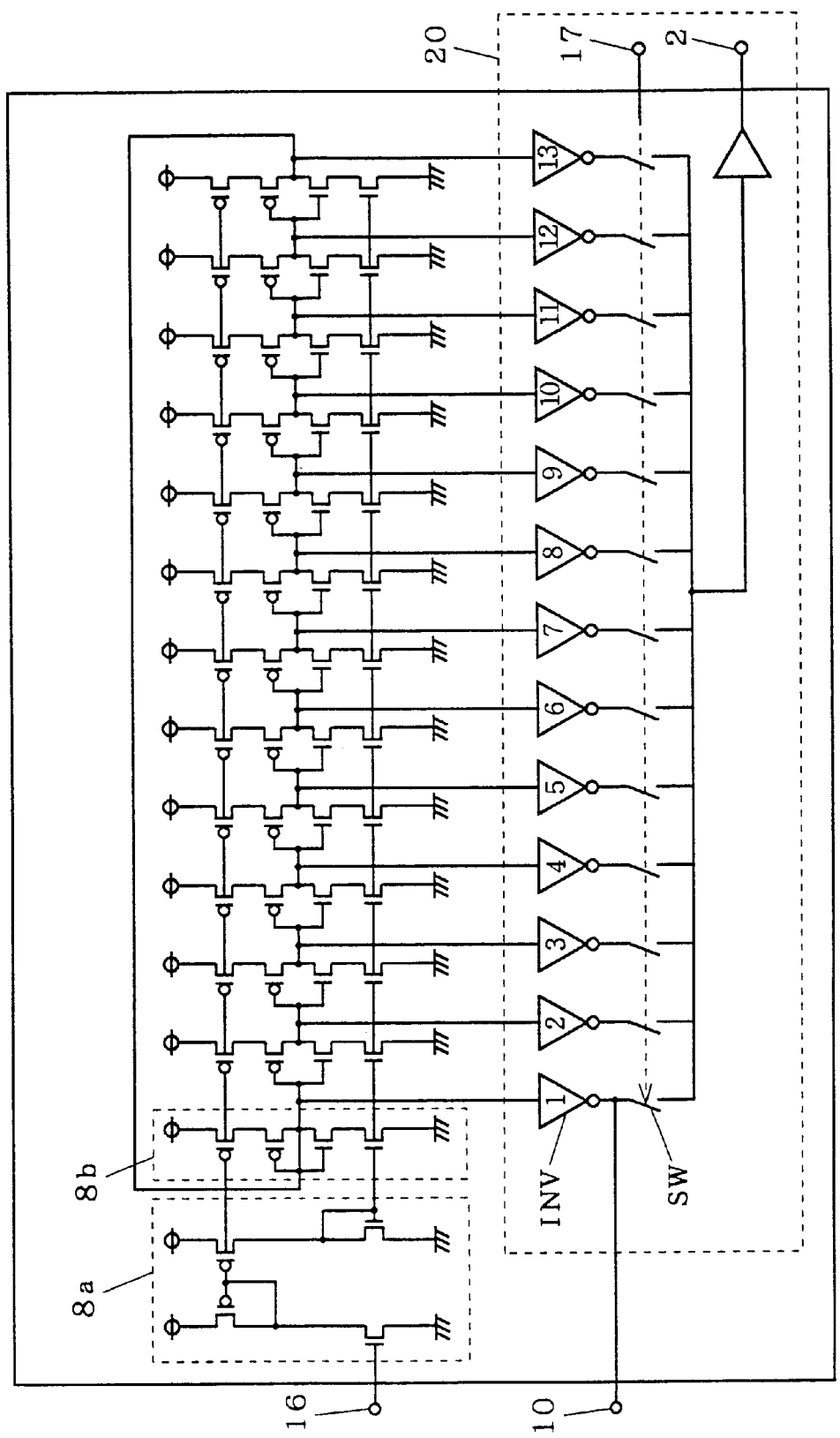
FIG. 4 is a circuit diagram showing the internal structure of the voltage-controlled oscillator 8'.

FIG. 4 is a circuit diagram showing the inside structure of the voltage-controlled oscillator 8'. In FIG. 4, 8b denotes an inverting amplifier, 8a denotes a control portion for controlling the inverting amplifiers according to a signal at the input terminal 16, SW denotes a switch, INV denotes an inverter and other reference characters correspond to those in FIG. 3. Next, the structure of the voltage-controlled oscillator 8' will be described. The plurality of inverting amplifiers 8b are connected in a loop to form a ring oscillator. An output of each inverting amplifier 8b is connected to an input of each inverter INV. An output of each inverter INV is connected to an input of each switch SW. An output of each switch SW is connected to the output terminal 2 through one buffer. The input of the control portion 8a is connected to the input terminal 16 and its output is connected to the plurality of inverting amplifiers 8b. The switches SW and the decoder 9 form delay signal selecting means.

Figure 5:
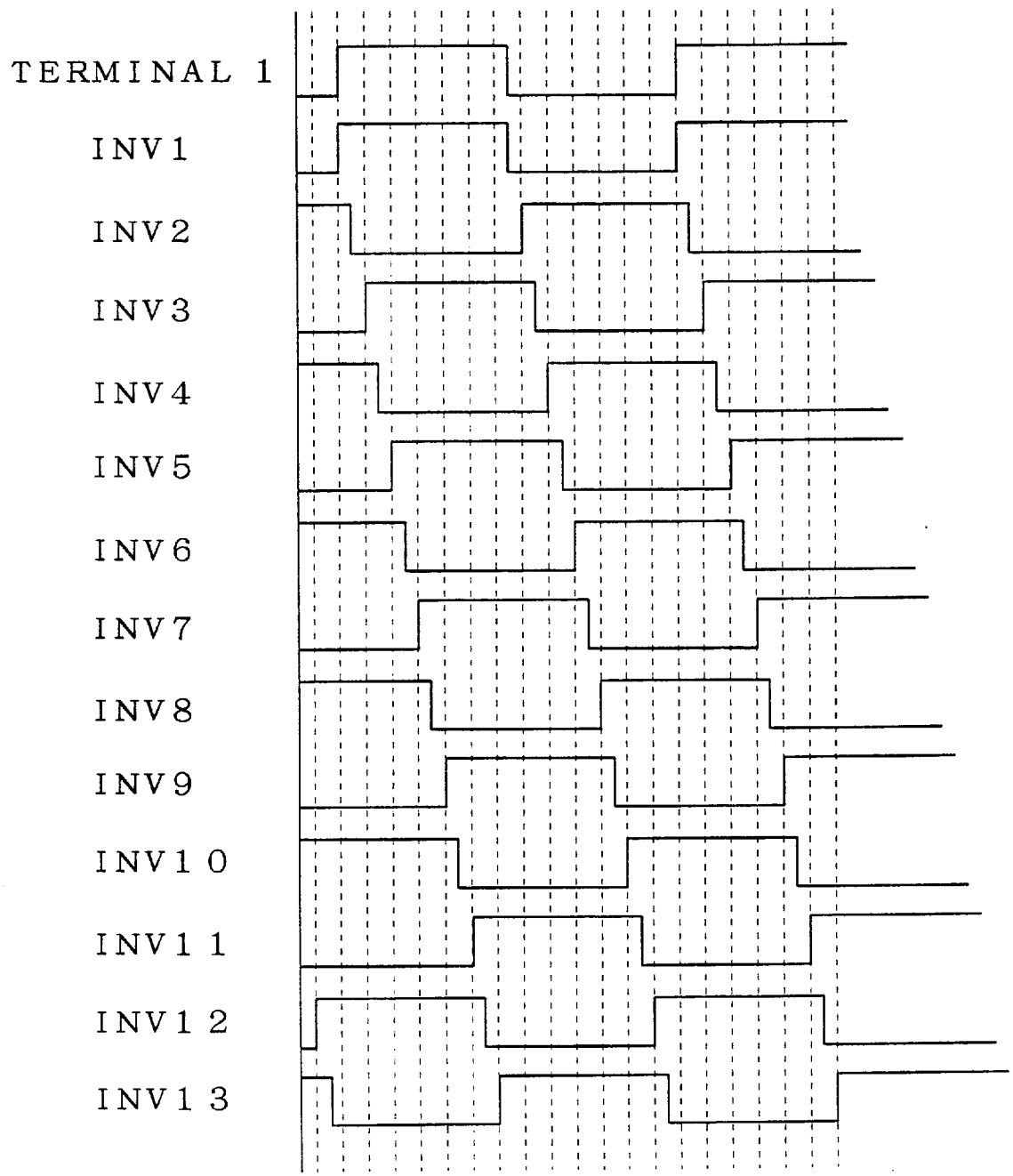
FIG. 5 is a timing chart showing signals of outputs of the plurality of inverting amplifiers 8b connected in a ring shown in FIG. 4.

Next, operation of the voltage-controlled oscillator 8' will be described. FIG. 5 is a timing chart showing signals of outputs of individual inverters INV connected to the plurality of inverting amplifiers 8b in FIG. 4. The INV1 in FIG. 5 corresponds to the inverter INV having its output connected to the output terminal 10 and the remaining INV2 to INV13 in FIG. 5 correspond to the inverters INV provided in order following the inverter INV1. The control portion 8a limits a current supplied to each inverting amplifier 8b according to a voltage at the input terminal 16. This controls a delay time between input and output of each inverting amplifier 8b. A delay time of each inverting amplifier 8b corresponds to a cycle of an external clock signal divided by the number of the inverting amplifiers 8b. For the signal of the output of the INV1, a signal in phase with the external clock signal at the input terminal 1 is generated. A control signal at the input terminal 17 turns on a switch SW in one of the 13 switches SW. Accordingly, with the control signal at the input terminal 17, an internal clock signal delayed in phase by an integral multiple of cycle CL/13 with respect to the external clock signal is outputted from the output terminal 2.

The relation between a switch SW which is turned on and the phase of the internal clock signal with respect to the external clock signal will now be shown. The switch connected to the INV1 is taken as SW1, the switch connected to the INV2 is taken as SW2, and so forth. When the SW1 is turned on, the phase is the same. When the SW2 is turned on, the phase is advanced by cycle CL×6/13. When the SW3 is turned on, the phase is delayed by cycle CL/13. When the SW4 is turned on, the phase is advanced by cycle CL×5/13. When the SW5 is turned on, the phase is delayed by cycle CL×2/13. When the SW6 is turned on, the phase is advanced by cycle CL×4/13. When the SW7 is turned on, the phase is delayed by cycle CL×3/13. When the SW8 is turned on, the phase is advanced by cycle CL×3/13. When the SW9 is turned on, the phase is delayed by cycle CL×4/13. When the SW10 is turned on, the phase is advanced by cycle CL×2/13. When the SW11 is turned on, the phase is delayed by cycle CL×5/13. When the SW12 is turned on, the phase is advanced by cycle CL/13. When the SW13 is turned on, the phase is delayed by cycle CL×6/13.

Figure 6:
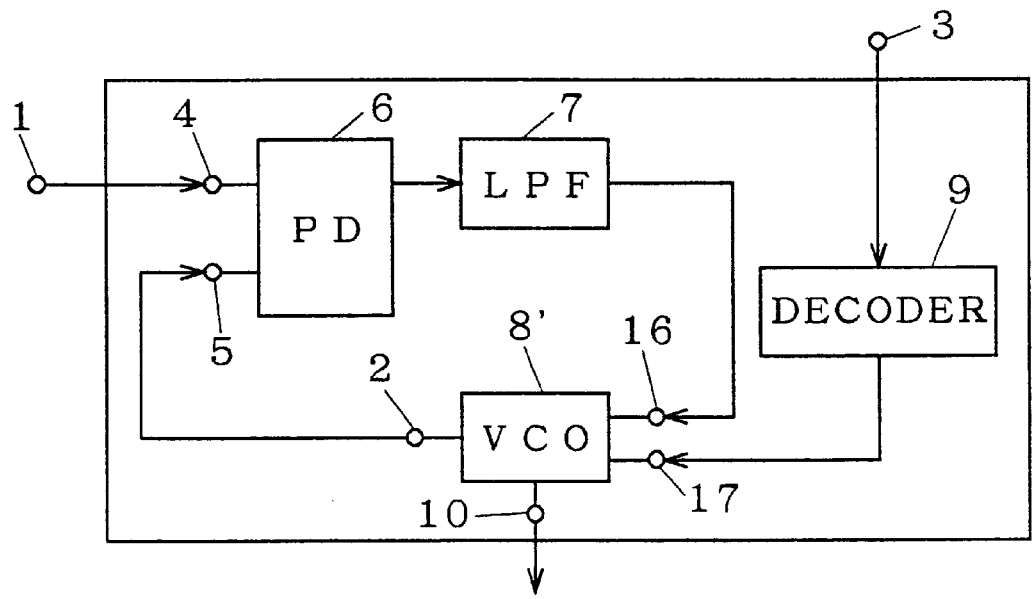
FIG. 6 is a block diagram showing another example of the semiconductor device of the first preferred embodiment of the present invention.

As shown in FIG. 6, the output terminal 2 and the output terminal 10 of FIG. 3 may be exchanged. An example of an LSI containing the semiconductor device shown in FIG. 3 is the same as that shown in FIG. 14.

In addition to the effects of the background of the preferred embodiments, this preferred embodiment which realizes the delay time in the voltage-controlled oscillator 8' reduces the layout area. Furthermore, since the delay time is not realized with a capacitance C and a resistance R, the delay time does not change due to different processes, and the delay time does not change due to different finish states caused by different conditions in the same process.

The unit of the delay time corresponds to the cycle of an input external clock signal divided by the number of inverting amplifiers forming the ring oscillator. Hence, the selectable delay time can be set in the range from the unit to one cycle of the external clock signal in the unit. Accordingly, unlike the background of the preferred embodiments, it can be adapted to various external clock signals with various cycles.

Second Preferred Embodiment

Figure 7:
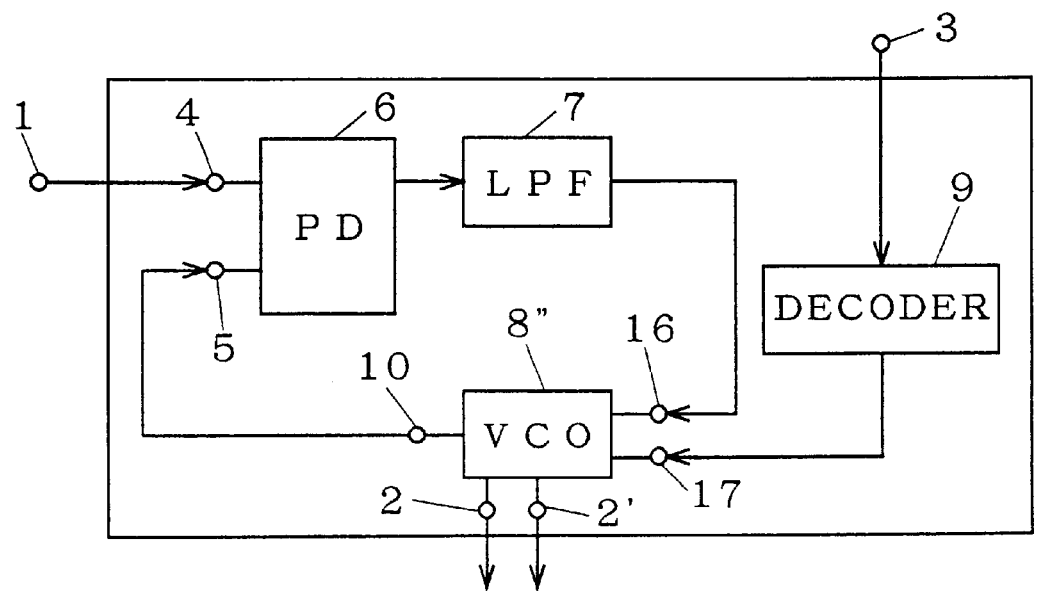
FIG. 7 is a block diagram showing a semiconductor device of a second preferred embodiment of the present invention.

FIG. 7 is a block diagram showing a semiconductor device according to a second preferred embodiment of the present invention. In FIG. 7, 8" denotes a voltage-controlled oscillator corresponding to the voltage-controlled oscillator 8' of FIG. 3, 2' denotes an output terminal and other reference characters correspond to those in FIG. 3.

Figure 8:
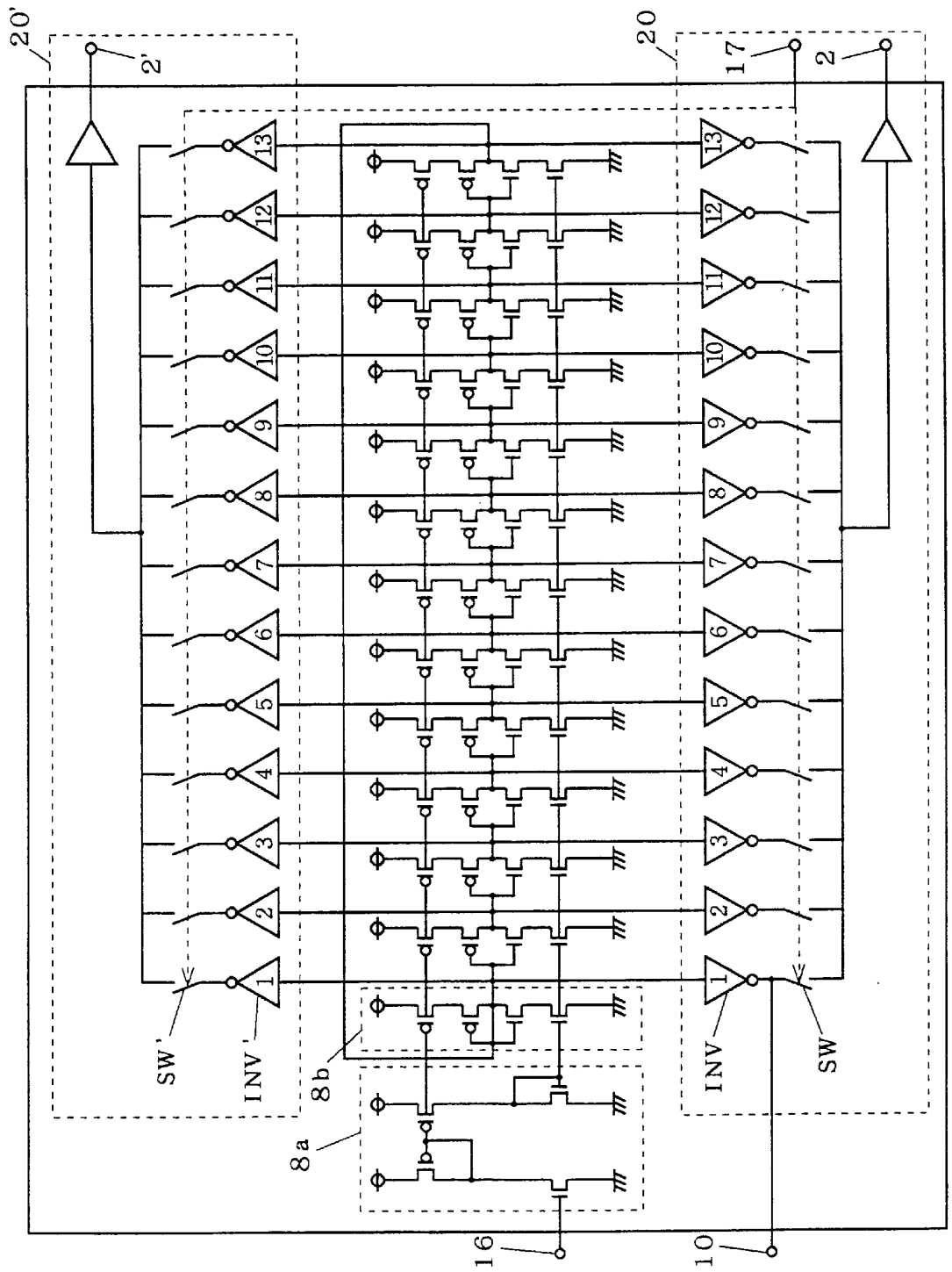
FIG. 8 is a circuit diagram showing the internal structure of the voltage-controlled oscillator 8".

FIG. 8 is a circuit diagram showing the internal configuration of the voltage-controlled oscillator 8'. In FIG. 8, SW' denotes a switch, INV' denotes an inverter, and other reference characters correspond to those in FIG. 4. Next, the structure of the voltage-controlled oscillator 8" will be described. An output of each inverting amplifier 8b is connected to an input of each inverter INV'. An output of each inverter INV' is connected to an input of each switch SW'. An output of each switch SW' is connected to the output terminal 2' through one buffer. The number of bits of a control signal that the decoder 9 outputs is 26. The plurality of bits are individually assigned to the switches SW in the delay circuit blocks Dn. The structure is the same as that of FIG. 4 in other respects. That is to say, the voltage-controlled oscillator 8" further includes the circuit portion 20' which is the same as the circuit portion 20 having the switches SW, the inverters INV and the output terminal 2 of the voltage-controlled oscillator 8'. The switches SW, SW' and the decoder 9 form delay signal selecting means.

Next, operation of the voltage-controlled oscillator 8" will be described. The operation of the circuit portion 20' is the same as that of the circuit portion 20. The plurality of switches SW, SW' can be independently turned on or off depending on the address value at the input terminal 3. Accordingly, it is possible to independently control delays of the clock signals at the output terminal 2 and the output terminal 2'. Supplying the two clock signals individually to a data output stage latch and a data input stage latch allows independent adjustment of the setup time and the hold time of data.

Figure 9:
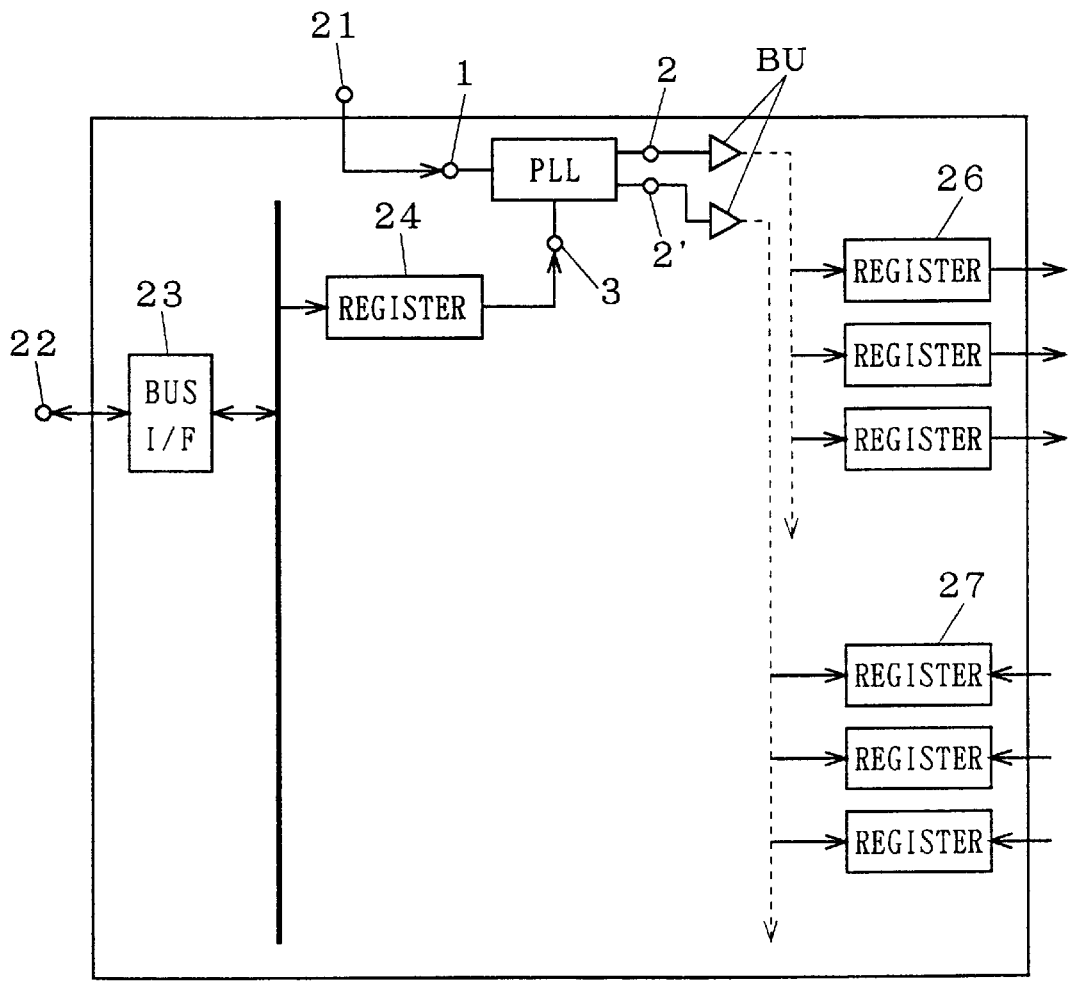
FIG. 9 is a block diagram showing the inside of an LSI having the PLL circuit of the second preferred embodiment of the present invention.

FIG. 9 is a block diagram showing an example of an LSI containing the semiconductor device shown in FIG. 7. In FIG. 9, 26 and 27 denote registers (latch circuits), PLL denotes the semiconductor device shown in FIG. 7, and other characters correspond to those in FIG. 7 and FIG. 14. The internal clock signal outputted to the output terminal 2 is provided to individual parts in the LSI including the register 26 through the buffer BU. The internal clock signal outputted to the output terminal 2' is provided to individual parts in the LSI including the register 27 through the buffer BU. The register 26 is an output-stage latch for outputting internal data generated inside the LSI in synchronization with the internal clock signal from the output terminal 2. The register 27 is an input-stage latch for capturing external data generated outside the LSI in synchronization with the internal clock signal from the output terminal 2'.

First, operations of the register 26 and the register 27 shown in FIG. 9 will be described. The register 26 externally outputs internal data generated inside the LSI at timing of an edge of the internal clock signal from the output terminal 2. Hence, by controlling the delay time of the internal clock signal at the output terminal 2 with respect to the external clock signal with the control signal, the hold time of the external clock signal and the internal data can be adjusted.

The register 27 takes in external data generated outside the LSI at timing of an edge of the internal clock signal from the output terminal 2'. Thus controlling the delay time of the internal clock signal at the output terminal 2' with respect to the external clock signal with the control signal allows adjustment of the setup time in the internal clock signal and the external data.

This preferred embodiment provides the effect of facilitating adjustment of the hold time and the setup time by outputting a plurality of internal clock signals whose delay times are independently controllable, in addition to the effects of the first preferred embodiment.

While the invention has been described in detail, the foregoing description is in all aspects illustrative and not restrictive. It is understood that numerous other modifications and variations can be devised without departing from the scope of the invention.

We claim:

1. A semiconductor device comprising:

a voltage-controlled oscillator comprising a number of inverting amplifiers, each inverting amplifier generating a delay signal having a different delay time with respect to a reference clock signal;

a decoder for transmitting a control signal to said voltage-controlled oscillator for selecting one of said delay signals;

a CPU for generating an address value that indicates one of said delay signals according to the cycle of said reference clock signal and outputting said address value to said decoders; and a first output terminal for outputting a first phase shifted delayed clock signal in response to said selection, wherein the delay times generated by each of said inverting amplifiers correspond to the reference clock signal divided by a value corresponding to the number of inverting amplifiers.

2. The semiconductor device of claim 1 wherein said voltage-controlled oscillator further comprises:

an input terminal for receiving a voltage; and a control portion for controlling a current supplied to each inverting amplifier according to said voltage at said input terminal.

3. The semiconductor device of claim 1 further comprising a phase detector and a loop filter, wherein said phase detector, loop filter and voltage-controlled oscillator form a phase locked loop circuit.

4. The semiconductor device of claim 1 wherein said voltage-controlled oscillator further comprises a first plurality of switches, each first switch being associated with a respective inverting amplifier, wherein a closing of a first switch results in the delay signal of the respective inverting amplifier being transferred to said first output terminal.

5. The semiconductor device of claim 4 wherein said voltage-controlled oscillator further comprises a first plurality of inverters, each inverter being connected between an output of a respective inverting amplifier and said associated first switch.

6. The semiconductor device of claim 4 further comprising a second output terminal for outputting a second phase shifted delayed clock signal.

7. The semiconductor device of claim 6 wherein said second phase shifted delayed clock signal is different than said first phase shifted delayed clock signal.

8. The semiconductor device of claim 6 wherein said voltage-controlled oscillator further comprises a second plurality of switches, each second switch being associated with a respective inverting amplifier, wherein a closing of a second switch results in the delay signal of the respective inverting amplifier being transferred to said second output terminal.

9. The semiconductor device of claim 6 wherein said voltage-controlled oscillator further comprises a second plurality of inverters, each inverter being connected between an output of a respective inverting amplifier and its associated second switch.

10. The semiconductor device of claim 6 further comprising:

a first latch for receiving said second phase shifted delayed clock signal and capturing externally generated data in response thereto; and a second latch for receiving said first phase shifted delayed clock signal and for outputting internally generated data in response thereto.

* * * * *